US011723159B2

(12) United States Patent
Lee et al.

(10) Patent No.: US 11,723,159 B2
(45) Date of Patent: Aug. 8, 2023

(54) THERMALLY INSULATED, RIGID CABINET

(71) Applicants: Fang-Shou Lee, Taoyuan (TW); Cho-Han Lee, Taoyuan (TW)

(72) Inventors: Fang-Shou Lee, Taoyuan (TW); Cho-Han Lee, Taoyuan (TW); Fang Wang, Livermore, CA (US)

(73) Assignees: Fang-Shou Lee, Taoyuan (TW); Cho-Han Lee, Taoyuan (TW)

(*) Notice: Subject to any disclaimer, the term of this patent is extended or adjusted under 35 U.S.C. 154(b) by 130 days.

(21) Appl. No.: 17/385,901

(22) Filed: Jul. 26, 2021

(65) Prior Publication Data
US 2023/0026587 A1    Jan. 26, 2023

(51) Int. Cl.
*H05K 5/00* (2006.01)
*H05K 5/02* (2006.01)
*H05K 7/14* (2006.01)

(52) U.S. Cl.
CPC ......... *H05K 5/0213* (2013.01); *H05K 7/1488* (2013.01)

(58) Field of Classification Search
CPC .............. H05K 5/0213; H05K 7/1488; E04C 2002/001; E04C 2/38; A47B 2220/13; A47B 81/00; B32B 2250/03; B32B 2307/54; B32B 3/12; B32B 2419/00
USPC ................ 312/400, 223.1, 265.1–365.4, 312/265.1–265.4; 52/223.6, 223.7, 291, 52/784.14, 793.1, 630; 428/116
See application file for complete search history.

(56) References Cited

U.S. PATENT DOCUMENTS

| 1,724,284 | A | * | 8/1929 | Imshenetsky | ............. E04B 2/56 52/562 |
|---|---|---|---|---|---|
| 2,027,831 | A | * | 1/1936 | Kunz | ........................ E05F 5/02 52/291 |
| 2,610,365 | A | * | 9/1952 | Manley | ..................... E04H 3/30 52/261 |
| 3,529,389 | A | * | 9/1970 | Wilkins | ................ E04B 1/6125 52/794.1 |
| 3,529,394 | A | * | 9/1970 | Wilkins | .................. E04C 2/365 428/117 |

(Continued)

FOREIGN PATENT DOCUMENTS

| CN | 111946012 | * | 11/2020 |
|---|---|---|---|
| EP | 2910702 | * | 8/2015 |

OTHER PUBLICATIONS

CN111946012 Zhao et al English abs (Year: 2020).*

*Primary Examiner* — Janet M Wilkens

(57) ABSTRACT

Provided is a cabinet, which comprises a top cover, four tri-layer side walls and a tri-layer base. The top cover, the four tri-layer side walls and the tri-layer base are connected with and fixed to one another by aluminum extrusion fixing assemblies. The tri-layer structure includes an inner honeycomb panel, a middle strengthening assembly and an outer wall panel. The middle strengthening assembly is formed by a plurality of horizontal tension rods and a plurality of vertical tension rods intersecting. The inner honeycomb panel has a hexagonal-celled hollow geometric structure, which confers the panel with such properties as high pressure-endurable strength, light weight, excellent rigidity and high structural stability. In addition, the hexagonal hollow cells can also make the honeycomb panel capable of better thermal insulation by preventing the air flow.

2 Claims, 8 Drawing Sheets

(56) References Cited

U.S. PATENT DOCUMENTS

| | | | | |
|---|---|---|---|---|
| 3,621,624 | A | * | 11/1971 | Gustafson ............... E04D 3/352 |
| | | | | 52/262 |
| 3,881,569 | A | * | 5/1975 | Evans, Jr. ............. E04B 1/8218 |
| | | | | 428/137 |
| 4,038,803 | A | * | 8/1977 | Schoeller ............... E04G 23/02 |
| | | | | 52/741.1 |
| 4,143,501 | A | * | 3/1979 | Tuttle ..................... E04C 2/384 |
| | | | | 52/282.4 |
| 4,366,655 | A | * | 1/1983 | Mayer ...................... E04B 5/04 |
| | | | | 52/223.7 |
| 5,491,935 | A | * | 2/1996 | Coxum ..................... E04H 9/14 |
| | | | | 52/92.1 |
| 5,673,985 | A | | 10/1997 | Mitchell |
| 5,795,043 | A | * | 8/1998 | Johnson ................ A47B 81/00 |
| | | | | 312/324 |
| 5,875,596 | A | * | 3/1999 | Muller ................. E04B 2/7433 |
| | | | | 52/239 |
| 7,507,461 | B2 | * | 3/2009 | Wang ....................... B32B 7/12 |
| | | | | 428/116 |
| 8,599,540 | B2 | | 12/2013 | Fernandez |
| 8,901,438 | B2 | | 12/2014 | Lewis, II et al. |
| 9,049,800 | B2 | | 6/2015 | Shelnutt et al. |
| 2005/0042416 | A1 | | 2/2005 | Blackmon et al. |
| 2010/0019630 | A1 | * | 1/2010 | Leng ...................... F16B 12/50 |
| | | | | 312/107 |

\* cited by examiner

THERMALLY INSULATED, RIGID CABINET

BACKGROUND OF THE INVENTION

Field of Invention

The present invention relates to a cabinet. More specifically, this present invention relates to a cabinet with high pressure-endurable strength, light weight, and excellent rigidity, which is particularly applied to a liquid immersion cooling apparatus.

Description of the Related Art

Generally, a server cabinet must have good technical performance. With specific regard to the structure of the cabinet, special physical and chemical designs are usually carried out according to equipment's electrical and mechanical properties and users' requirements, ensuring its rigidity, electromagnetic isolation, ventilation, and heat dissipation. In addition, the server cabinet should also have anti-vibration, anti-shock, anti-corrosion, dustproof, waterproof, anti-radiation, etc. so as to ensure the stable and reliable operation of the equipment.

According to the load bearing, materials and manufacturing methods of cabinet components, server cabinets can be categorized into extrudate-structured cabinets and sheet-structured cabinets. Extrudate-structured cabinets, such as steel extrudate cabinets, are composed of shaped seamless steel tubes used as uprights. Such extrudate-structured cabinets have good rigidity and strength, but are heavy in weight. Sheet-structured cabinets, such as steel sheet cabinets, have side walls which are formed by bending a singular steel sheet. Such sheet-structured cabinets also have good rigidity and strength, but are not easy to assemble or repair due to the fact that side walls are not disassemblable. Moreover, the framework of a conventional server cabinet is made of castings or angle steels connected or welded by screws or rivets. Therefore, the conventional server cabinet is bulky and heavy.

As may be understood, a liquid immersion cooling server cabinet weighs up to about thousands of kilograms when it accommodates many servers, the cooling liquid, condensing devices, etc. Since the total weight of a liquid immersion cooling server cabinet is tremendously heavy, the server cabinet must have a good force-endurable structure. In view of this, in an effort to ensure that the server cabinet not only has good usability and reliability but is convenient for operation, installation and maintenance as well, it is necessary to develop a cabinet that is rigid, light in weight, and easy to install and maintain.

BRIEF SUMMARY OF THE INVENTION

The object of the present invention is to provide a thermally insulated, rigid cabinet whose side walls and base both have a tri-layer structure. The tri-layer structure includes an inner honeycomb panel, a middle strengthening assembly, and an outer wall panel. The inner honeycomb panel has a hexagonal-celled hollow geometric structure. Therefore, the cabinet of the present invention has such properties as high pressure-endurable strength, light weight, excellent rigidity and high structural stability. In addition, the hexagonal hollow cells can also make the honeycomb panel capable of better thermal insulation by preventing the air flow.

In order to attain the aforesaid object, according to one embodiment, provided is a thermally insulated, rigid cabinet, which comprises a top cover, four side walls, and a base. The four side walls and the base have a tri-layer structure. The tri-layer structure includes an inner honeycomb panel, a middle strengthening assembly, and an outer wall panel. The middle strengthening assembly is formed by a plurality of horizontal tension rods and a plurality of vertical tension rods intersecting. The top cover, the side walls, and the base are connected with and fixed to one another by aluminum extrusion fixing assemblies.

In one or more embodiments, wherein there is a first space formed between the inner honeycomb panel and the middle strengthening assembly.

In one or more embodiments, wherein there is a second space formed between the middle strengthening assembly and the outer wall panel.

In one or more embodiments, wherein the inner honeycomb panel has an array of hexagonal tubular cells.

In one or more embodiments, wherein the inner honeycomb panel has a thickness of between 2 cm and 5 cm.

In one or more embodiments, wherein the aluminum extrusion fixing assembly comprises a first aluminum extrusion tube, a second aluminum extrusion tube, and a third aluminum extrusion tube; the first aluminum extrusion tube is connected in parallel side-to-side to the second aluminum extrusion tube; the first aluminum extrusion tube is connected in perpendicular side-to-side to the third aluminum extrusion tube.

In one or more embodiments, wherein the first aluminum extrusion tube is provided with a first long groove located on a first sidewall thereof; a sidewall of the first long groove extends inwards to form a protruding portion; a leak-proof groove is provided on a bottom side within the first long groove.

In one or more embodiments, wherein the first aluminum extrusion tube is further provided with a second long groove located on a second sidewall perpendicular to the first sidewall thereof; a sidewall of the second long groove extends inwards to form a protruding portion; a leak-proof groove is provided on a bottom side within the second long groove.

As aforementioned, the present invention discloses a novel thermally insulated, rigid cabinet, characterized in that the four side walls and the base of the cabinet have a tri-layer structure. The tri-layer structure includes an inner honeycomb panel, a middle strengthening assembly, and an outer wall panel. The inner honeycomb panel has a hexagonal-celled hollow geometric structure, and the middle strengthening assembly is formed by a plurality of horizontal tension rods and a plurality of vertical tension rods intersecting. The top cover, the side walls, and the base are connected with and fixed to one another by aluminum extrusion fixing assemblies. Therefore, the tri-layer structure confers the cabinet of the present invention with such properties as high pressure-endurable strength, light weight, excellent rigidity and high structural stability. In addition, the hexagonal hollow cells can also make the honeycomb panel capable of better thermal insulation by preventing the air flow.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION OF THE INVENTION

Figure 1:
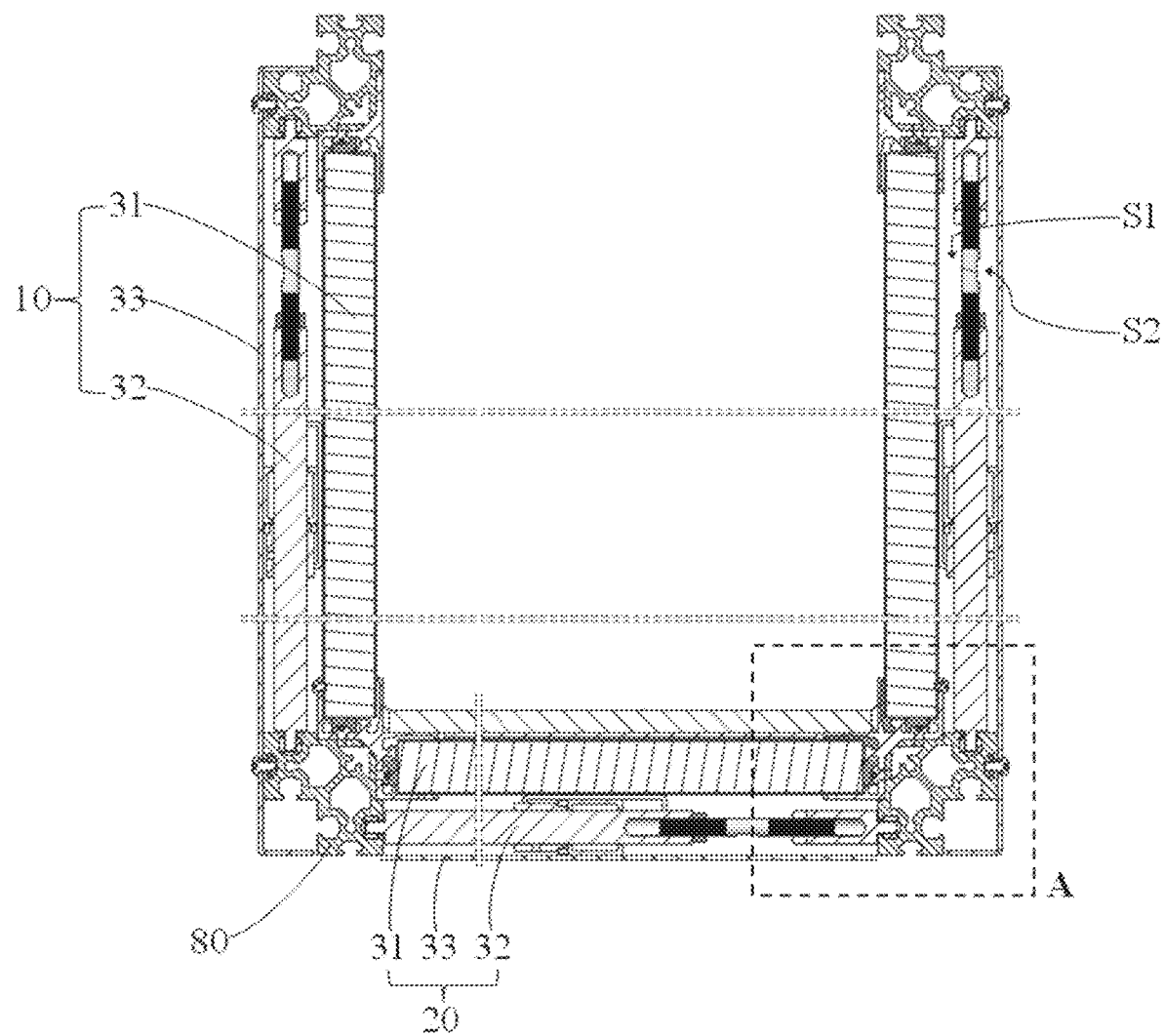
FIG. 1 is a front plan view of a longitudinal section through an example thermally insulated, rigid cabinet, according to one or more embodiments.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not for other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments. In the illustration of the various embodiments, two different figures can be provided that have overlaps and/or similarities in the components within the two figures. In such instances, the descriptions of these figures can be presented together with associated similar reference numerals separated by commas and/or a slash. Some components that are not expected to be different from one implementation to the other are provided the same reference numerals within the figures, to simplify the descriptions of the figures.

Those of ordinary skill in the art will appreciate that the hardware components and basic configuration depicted in any of the figures illustrated by the drawings and described herein may vary. For example, the illustrative components of a thermally insulated, rigid cabinet (FIG. 7) are not intended to be exhaustive, but rather be representative of and highlight components that can be utilized to implement aspects of the present disclosure. For example, other devices/components may be used in addition to or in place of the hardware depicted. The depicted examples do not convey or imply any architectural or other limitations with respect to the presently described embodiments and/or the general disclosure.

The object of the present invention is to provide a thermally insulated, rigid cabinet. Both the side walls and the base are specially designed by way of a novel structure that has high pressure-endurable strength, light weight, excellent rigidity and high stability.

Turning now to the figures, FIG. 1 is a front plan view of a longitudinal section through an example thermally insulated, rigid cabinet. According to one embodiment, provided is a thermally insulated, rigid cabinet, which comprises a top cover (not shown), four side walls 10, and a base 20. The top cover, the four side walls 10, and the base 20 are connected with and fixed to one another by an aluminum extrusion fixing assembly 80. The cabinet can be used to accommodate a cooling liquid and a plurality of heat-generating components submerged within the cooling liquid, such as servers, etc. In addition, both the side walls 10 and the base 20 have a tri-layer structure that includes an inner honeycomb panel 31, a middle strengthening assembly 32, and an outer wall panel 33. The tri-layer structure can strengthen the stability of the side walls 10 and the base 20. It's noteworthy that there is a first space S1 formed between the inner honeycomb panel 31 and the middle strengthening assembly 32, and there is a second space S2 formed between the middle strengthening assembly 32 and the outer wall panel 33. Any heat-insulating material can be accommodated in either the first space S1 or the second space S2 to achieve the effect of heat insulation.

Figure 2:
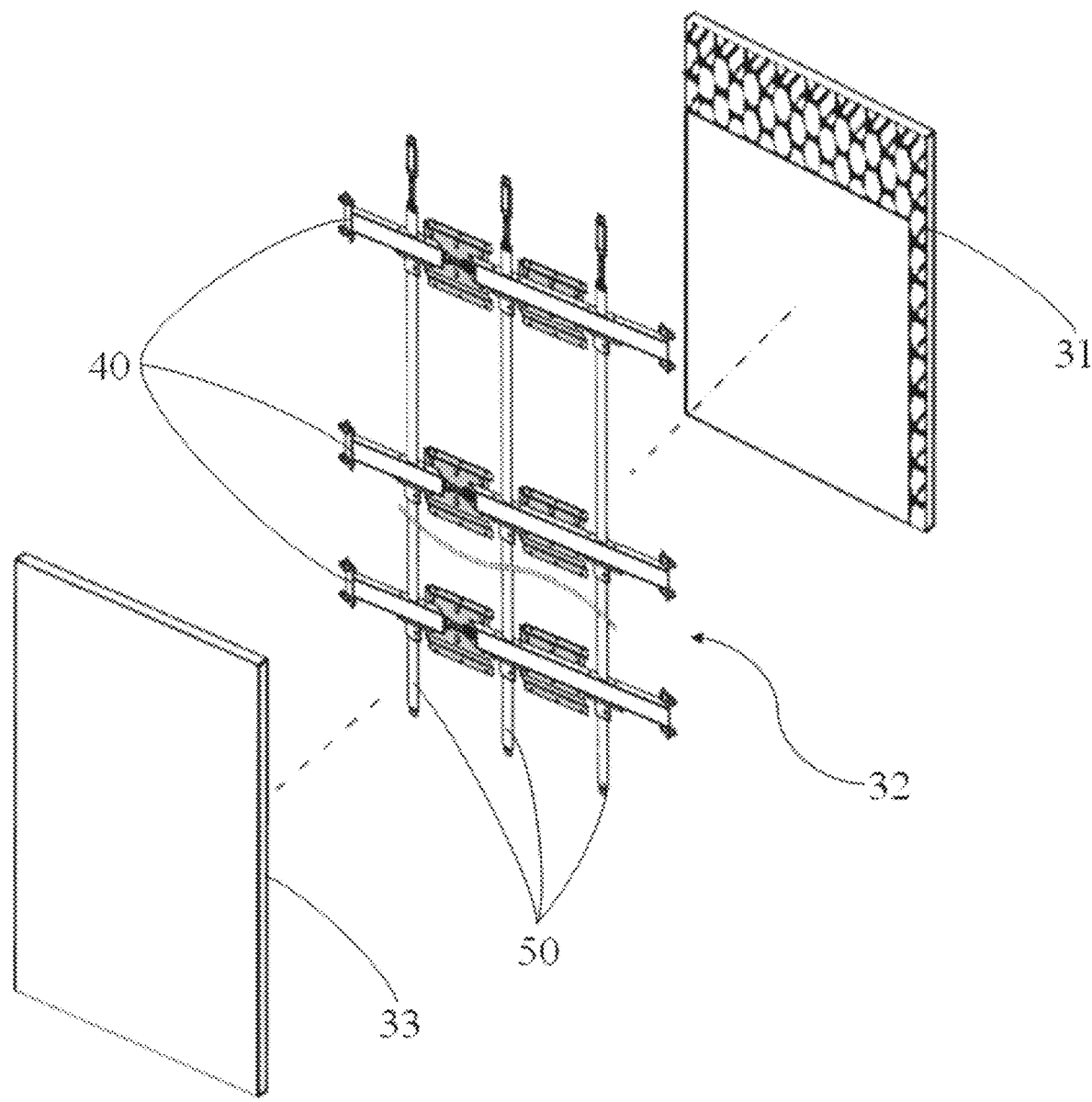
FIG. 2 is an exploded perspective view of an example tri-layer structure applied to both a side wall and a base of the present cabinet, according to one or more embodiments.

Next, in order to further describe the special structural design of the side walls and the base of the cabinet, with reference now to FIG. 2, there is presented an exploded perspective view of an example tri-layer structure applied to a side wall and a base of the present cabinet. According to this embodiment, in order to make the cabinet light in weight, stiff in rigidity and stable in structure, in principle, both the side walls 10 and the base 20 of the cabinet are composed of a tri-layer structure. The tri-layer structure includes an inner honeycomb panel 31, a middle strengthening assembly 32, and an outer wall panel 33. Specifically, the outer wall panel 33 is located outside the middle strengthening assembly 32, and the middle strengthening assembly 32 is located outside the inner honeycomb panel 31, that is, the inner honeycomb panel 31, the middle strengthening assembly 32, and the outer wall panel 33 are arranged in a particular order and connected to one another, thereby forming the tri-layer structure of the side walls 10 and the base 20 of the cabinet. In addition, it should be noted that the middle strengthening assembly 32 is formed by a plurality of horizontal tension rods 40 and a plurality of vertical tension rods 50 intersecting. Moreover, the inner honeycomb panel 31 has a sandwich structure with many honeycomb cells of the same stiffness, and the thickness of the inner honeycomb panel 31 is between 2 cm and 5 cm. The inner honeycomb panel 31 can be made of aluminum or steel; in a preferred embodiment, the inner honeycomb panel 31 is an aluminum honeycomb panel. Because the aluminum honeycomb panel has a honeycomb core which is composed of many hollow cells, its weight is only one-twentieth the weight of an aluminum panel in terms of the same size. Besides, having the interconnected honeycomb cells evenly distributing inside the entire aluminum honeycomb panel makes the aluminum honeycomb panel more stable and not vulnerable to deform. More importantly, the honeycomb cells inside the aluminum honeycomb panel are hexagonal hollow cells, conferring the panel with such properties as high pressure-endurable strength, light weight, excellent rigidity and high structural stability.

Figure 3:
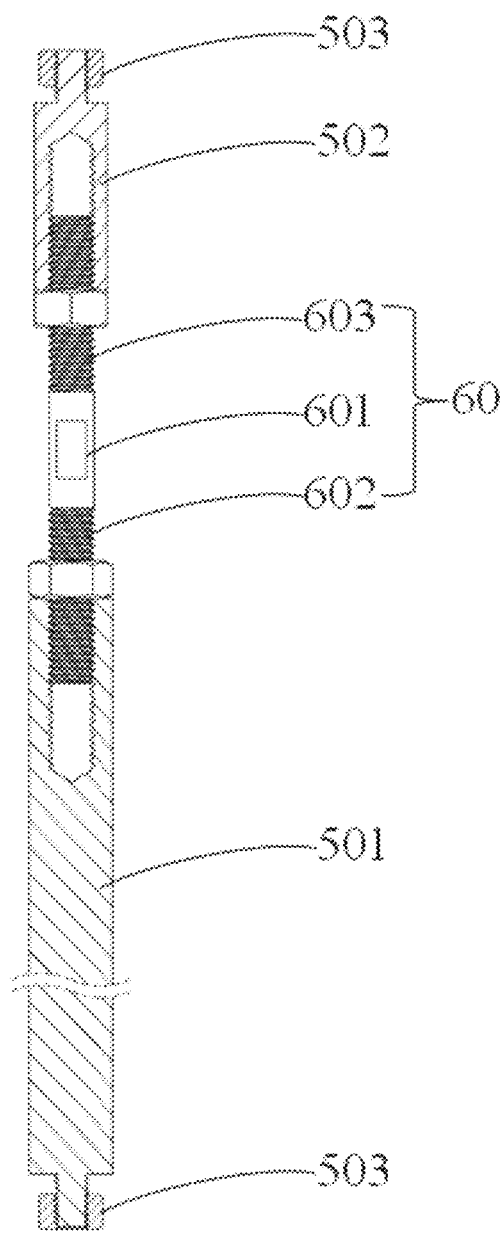
FIG. 3 is a front structural plan view of a longitudinal section through an example vertical tension rod, according to one or more embodiments.

Furthermore, in order to specifically describe the structure of the vertical tension rod of the present invention, with reference now to FIG. 3, there is presented a front structural plan view of a longitudinal section through an example vertical tension rod. According to one embodiment, as shown in FIG. 3, the vertical tension rod 50 includes a body 501 and a connecting component 502. The body 501 is connected to the connecting component 502 with an adjusting assembly 60. Both ends of the vertical tension rod 50 are provided with a fixing component 503. The adjusting assembly 60 includes an adjusting block 601, a first bolt 602 provided on one end of the adjusting block 601, and a second bolt 603 provided on the other end of the adjusting block 601. The first bolt 602 has an external left-hand thread, and the second bolt 603 has an external right-hand thread. Specifically, at least a portion of the first bolt 602 is arranged in a hollow end of the body 501, and at least a portion of the second bolt 603 is arranged in a hollow end of the connecting component 502. As arranged so, by way of rotating the adjusting block 601, the first bolt 602 moves inside the hollow end of the body 501 at the same time that the second bolt 603 moves inside the hollow end of the connecting component 502, so that the vertical tension rod 50 can be extended or shortened.

Figure 4:
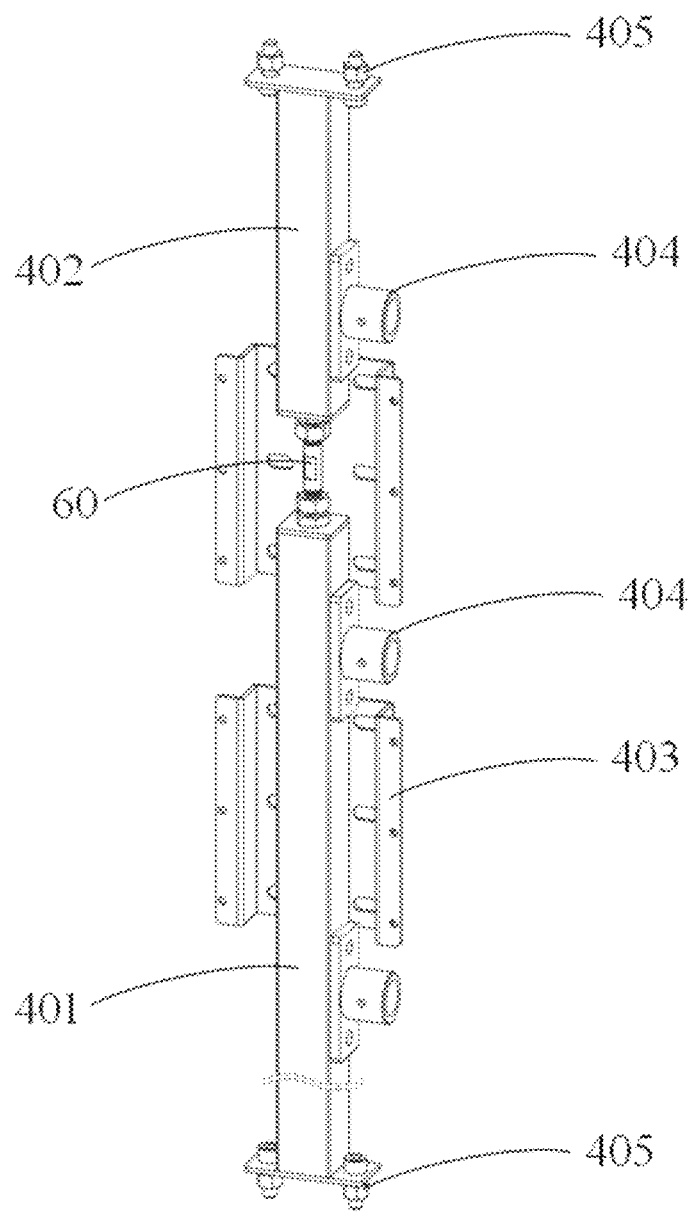
FIG. 4 is a front perspective view of an example horizontal tension rod, according to one or more embodiments.

Also, in order to specifically describe the structure of the horizontal tension rod of the present invention, with reference now to FIG. 4, there is presented a front perspective view of an example horizontal tension rod. According to one embodiment, as shown in FIG. 4, the horizontal tension rod 40 includes a first horizontal section 401 and a second horizontal section 402. The first horizontal section 401 is connected to the second horizontal section 402 with an adjusting assembly 60. By way of rotating the adjusting assembly 60, the horizontal tension rod 40 can be extended or shortened. Both ends of the horizontal tension rod 40 are provided with a fixing component 405. Both the first horizontal section 401 and the second horizontal section 402 are provided with at least one fixing sleeve 404. In addition, the horizontal tension rod 40 further includes at least one fixing plate 403 mounted on either the first horizontal section 401 or the second horizontal section 402.

Figure 5:
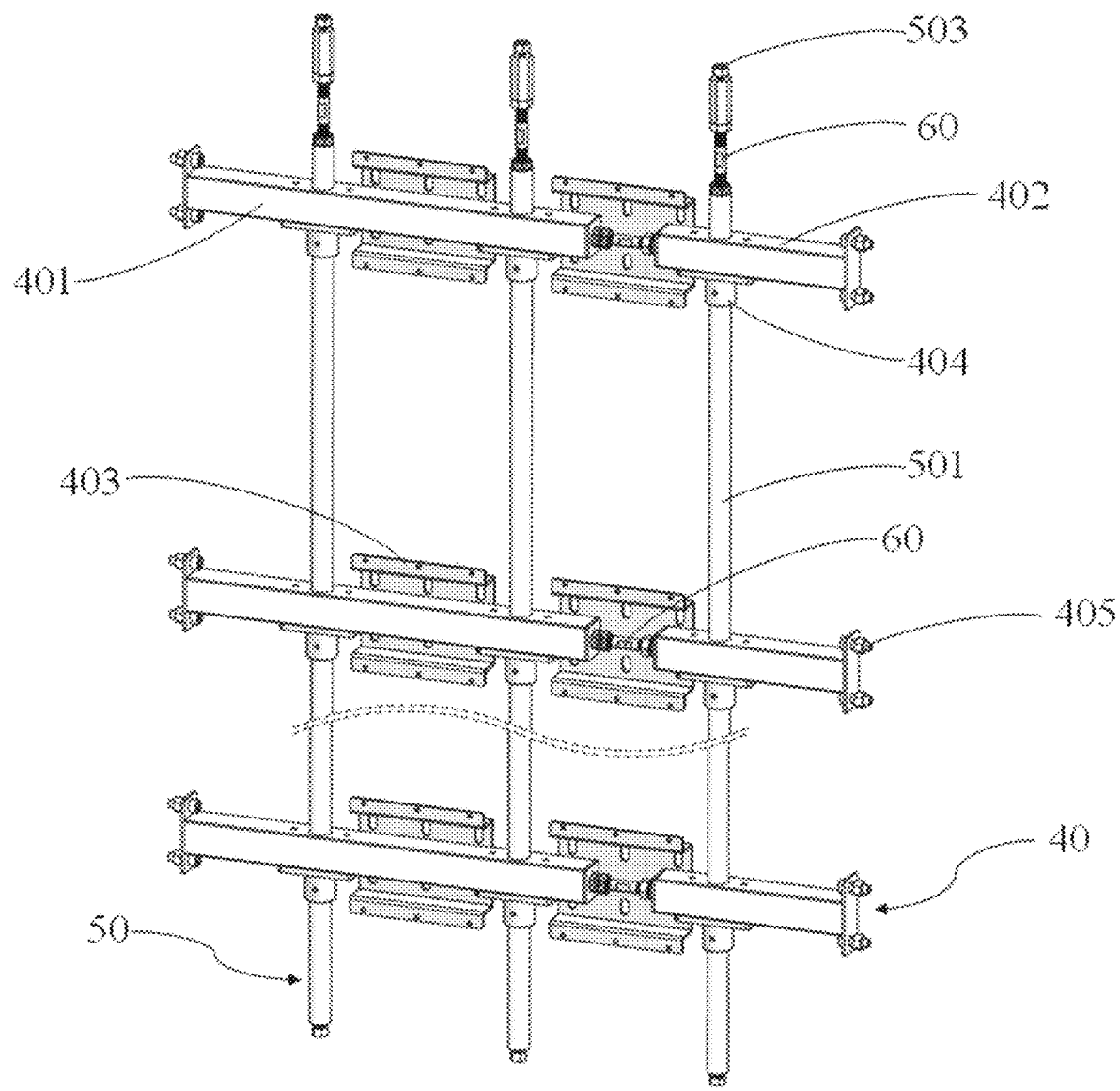
FIG. 5 is a front perspective view of an example middle strengthening assembly, according to one or more embodiments.

Next, it is further described how to use the horizontal tension rods and the vertical tension rods to form the middle strengthening assembly, with reference now to FIG. 5, there is presented a front perspective view of an example middle strengthening assembly. According to one embodiment, as shown in FIG. 5, the middle strengthening assembly 32 includes a plurality of horizontal tension rods 40 and a plurality of vertical tension rods 50. Specifically, a plurality of the bodies 501 of the vertical tension rods 50 penetrates the first horizontal sections 401 and the second horizontal sections 402 of the horizontal tension rods 40, and is positioned through the fixing sleeves 404. The fixing sleeves 404 can make the arrangement of the horizontal tension rods 40 and the vertical tension rods 50 more secure. In addition, the middle strengthening assembly 32 can be fixed onto the inner honeycomb panel 31 by way of the fixing plates 403. The adjusting assembly 60 can be used to randomly adjust the tension of either the horizontal tension rod 40 or the vertical tension rod 50. As a result, interlacing a plurality of the horizontal tension rods 40 with a plurality of the vertical tension rods 50 secures the structure of the side walls and the base of the cabinet, giving the cabinet high pressure-endurable strength, excellent rigidity and high stability.

Figure 6:
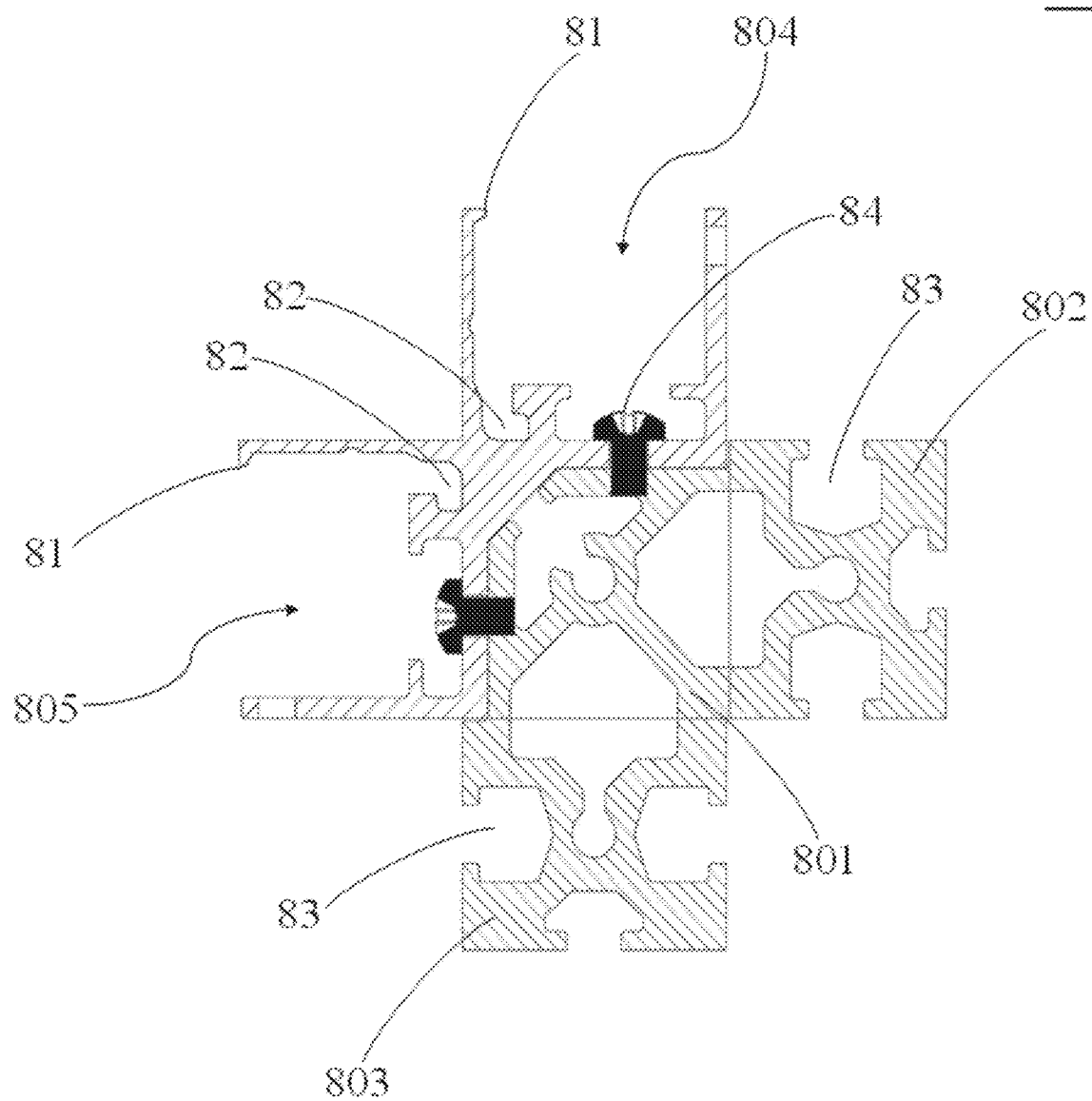
FIG. 6 is a front structural plan view of an example aluminum extrusion fixing assembly, according to one or more embodiments.

Moreover, in order to further illustrate the structure of the aluminum extrusion fixing assembly, with reference now to FIG. 6, there is presented a front structural plan view of an example aluminum extrusion fixing assembly. According to one embodiment, the aluminum extrusion fixing assembly 80 includes three rectangular aluminum extrusion tubes, namely a first aluminum extrusion tube 801, a second aluminum extrusion tube 802, and a third aluminum extrusion tube 803. The first aluminum extrusion tube 801 is connected in parallel side-to-side to the second aluminum extrusion tube 802, and the first aluminum extrusion tube 801 is connected in perpendicular side-to-side to the third aluminum extrusion tube 803. The first aluminum extrusion tube 801 is provided with two long grooves positioned on the two adjacent sides thereof that are not connected to either the second aluminum extrusion tube 802 or the third aluminum extrusion tube 803, that is, a first long groove 804 is provided on a first side of the first aluminum extrusion tube 801, a second long groove 805 is provided on a second side that is perpendicular to the first side of the first aluminum extrusion tube 801. A sidewall of the first long groove 804 extends inwards to form a protruding portion 81, and a leak-proof groove 82 is provided on a bottom side within the first long groove 804. A sidewall of the second long groove 805 extends inwards to form a protruding portion 81, and a leak-proof groove 82 is provided on a bottom side within the second long groove 805. The second aluminum extrusion tube 802 is provided with a fixing groove 83 embedded in each side thereof that is not connected to the first aluminum extrusion tube 801. Similarly, the third aluminum extrusion tube 803 is also provided with a fixing groove 83 embedded in each side thereof that is not connected to the first aluminum extrusion tube 801. It should be noted that the long grooves can be designed connected with the aluminum extrusion tubes as a whole; on the other hand, the long grooves and the aluminum extrusion tubes can be designed as separate components that are to be connected with each other when used. Taking the aluminum extrusion fixing assembly shown in FIG. 6 for example, the first long groove 804 and the second long groove 805 are connected as an integrated long groove assembly, and the first aluminum extrusion tube 801, the second aluminum extrusion tube 802, and the third aluminum extrusion tube 803 are connected as an integrated aluminum extrusion tube assembly. When used, the integrated long groove assembly is connected with the integrated aluminum extrusion tube assembly by a fixing component 84 such as bolts.

Figure 7:
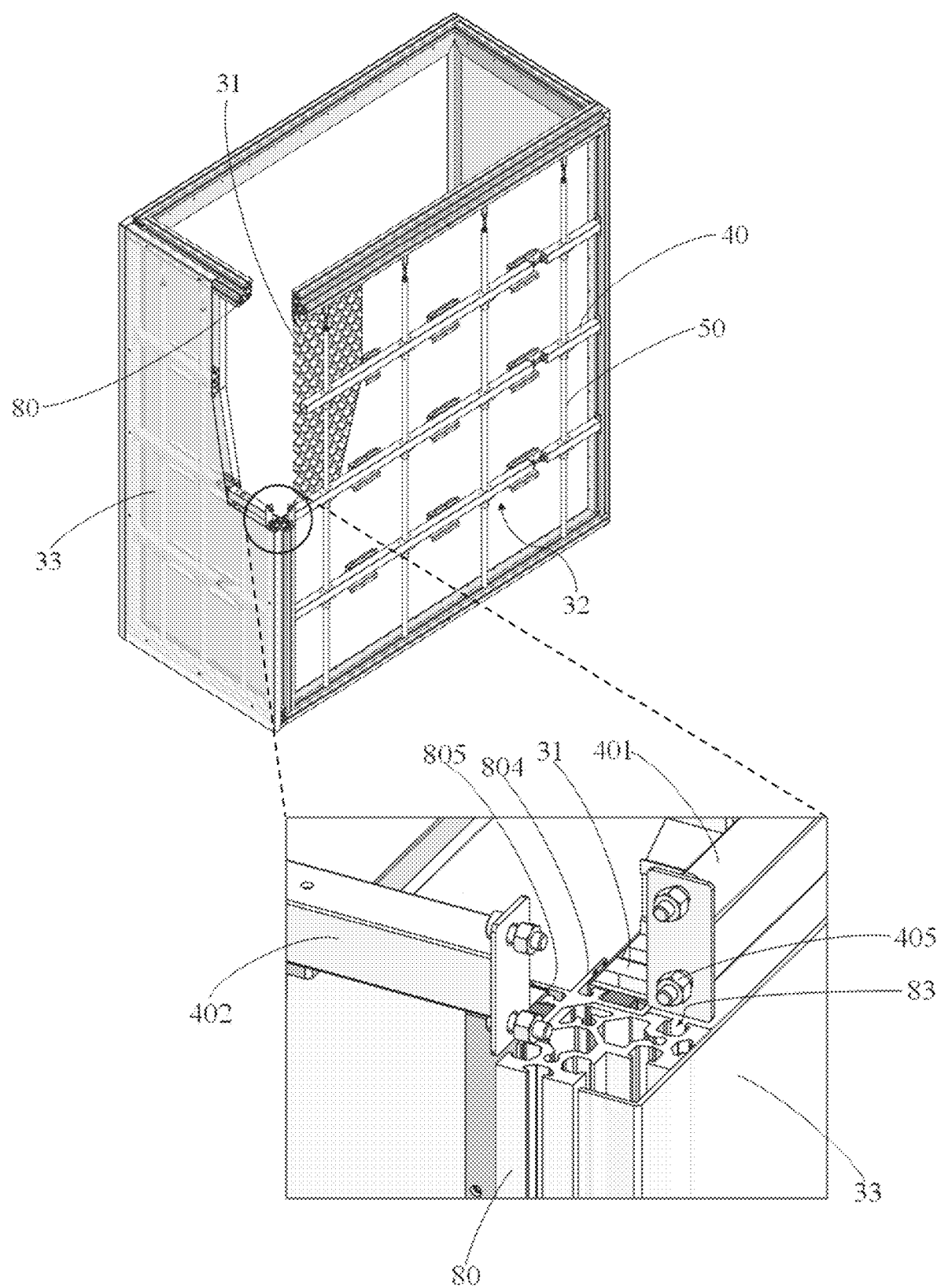
FIG. 7 is a front, top, left perspective view of an example thermally insulated, rigid cabinet, according to one or more embodiments.

As mentioned above, the cabinet can be used to accommodate a cooling liquid and a plurality of servers submerged within the cooling liquid. Therefore, when filled with the cooling liquid and the servers, the cabinet bears tremendous weight and pressure. In order to ensure that the cabinet has sufficient pressure endurance and stable structure, the side walls of the cabinet are assembled in a novel manner in which this purpose is achieved. Turning now to FIG. 7, there is presented a front, top, left perspective view of an example thermally insulated, rigid cabinet. According to one embodiment of the present invention, the side walls 10 have a tri-layer structure which includes an inner honeycomb panel 31, a middle strengthening assembly 32, and an outer wall panel 33. The inner honeycomb panel 31, the middle strengthening assembly 32, and the outer wall panel 33 are connected with and fixed to one another by the aluminum extrusion fixing assemblies 80.

Here is an example of how any two adjacent side walls are put together by way of the aluminum extrusion fixing assembly. Specifically, as shown in the partially enlarged perspective view in FIG. 7, with regard to one side wall, the inner honeycomb panel 31 is mounted in the first long groove 804 of the aluminum extrusion fixing assembly 80. The fixing components 405 of the first horizontal section 401 are slid into the fixing groove 83 of the aluminum extrusion fixing assembly 80, thereby connecting the middle strengthening assembly 32 with the aluminum extrusion fixing assembly 80. The outer wall panel 33 is placed outside the middle strengthening assembly 32, and connected with the aluminum extrusion fixing assembly 80. Similarly, with regard to the other adjacent side wall, the inner honeycomb panel 31 is mounted in the second long groove 805 of the aluminum extrusion fixing assembly 80. The fixing components 405 of the second horizontal section 402 are slid into the fixing groove 83 of the aluminum extrusion fixing assembly 80, thereby connecting the middle strengthening assembly 32 with the aluminum extrusion fixing assembly 80. The outer wall panel 33 is placed outside the middle strengthening assembly 32, and connected with the aluminum extrusion fixing assembly 80. As a result, any two adjacent side walls are connected with each other by way of the aluminum extrusion fixing assembly, thereby stabilizing the structure of the cabinet.

Figure 8:
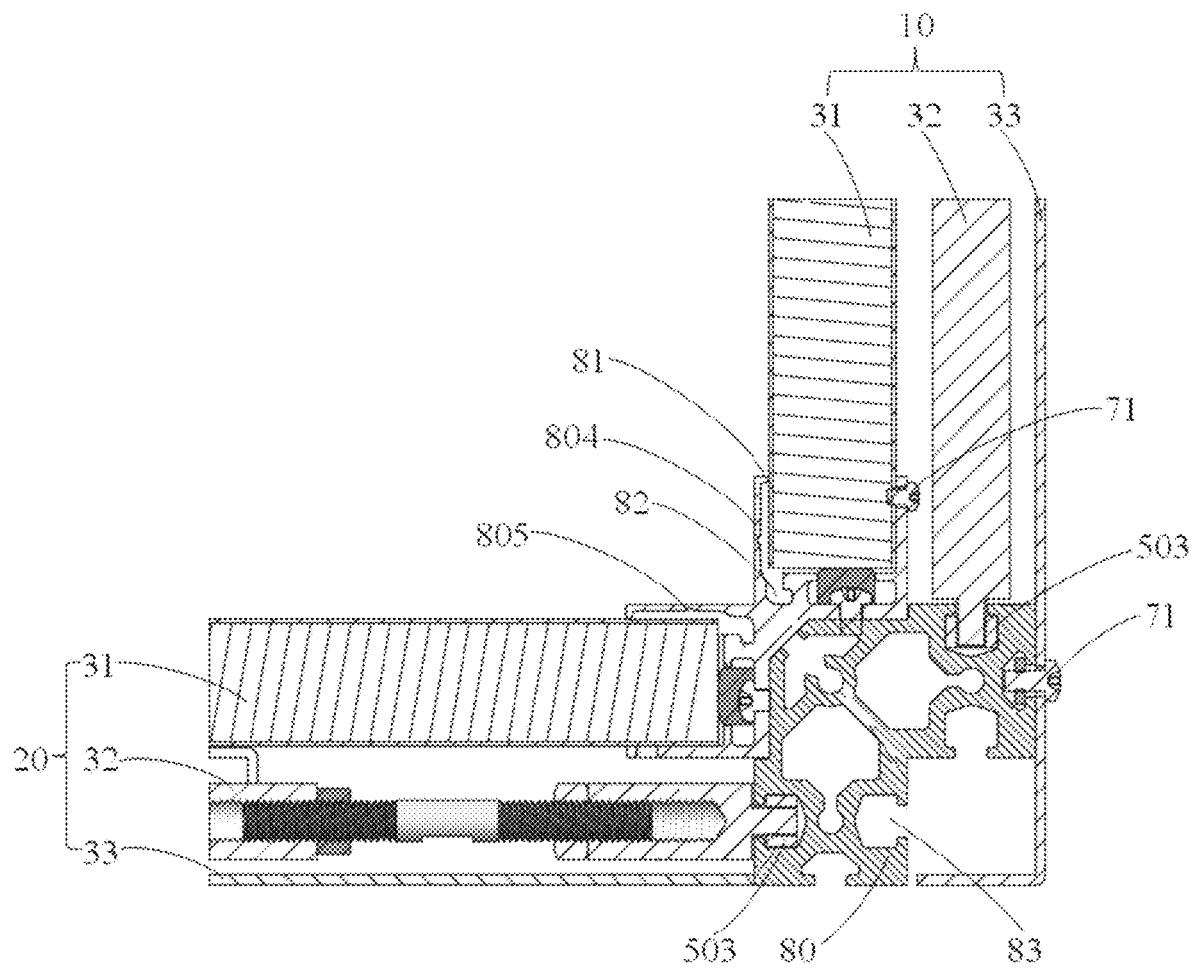
FIG. 8 is a partially enlarged plan view of the framed area as A in FIG. 1 illustrating how any one example side wall is connected with and fixed to an example base by an example aluminum extrusion fixing assembly, according to one or more embodiments.

Next, in order to specifically describe how the side wall and the base are fixed to and sealed with the aluminum extrusion fixing assembly, with reference now to FIG. 8, there is presented a partially enlarged plan view of the framed area as A in FIG. 1 illustrating how any one of the side walls is connected with and fixed to the base by the aluminum extrusion fixing assembly. According to one embodiment, the inner honeycomb panel 31 of the side wall 10 is placed in the first long groove 804 of the aluminum extrusion fixing assembly 80, and fixed to the first long groove 804 with a fixing component 71. The inner honeycomb panel 31 of the base 20 is placed in the second long groove 805 of the aluminum extrusion fixing assembly 80, and fixed to the second long groove 805 with a fixing component 71. The middle strengthening assembly 32 is connected with the aluminum extrusion fixing assembly 80 by sliding the fixing component 503 into the fixing groove 83 of the aluminum extrusion fixing assembly 80. The outer wall panel 33 is placed outside the middle strengthening assembly 32, and fixed to the aluminum extrusion fixing assembly 80 with a fixing component 71. Moreover, in order to ensure the tightness of the cabinet, a leak-proof groove 82 is provided on the interior bottom side of both the first long groove 804 and the second long groove 805. A sealant can be poured into the leak-proof groove 82 so that the inner honeycomb panel 31 can tightly adhere to the aluminum extrusion fixing assembly 80. It is worth noting that in order to avoid leakage of the sealant during the pouring process, both sidewalls of the first long groove 804 and the second long groove 805 extend inwards to form a protruding portion 81. The protruding portion 81 can prevent the sealant from leaking during the pouring process, thereby ensuring the tightness of the cabinet.

Based on the foregoing disclosure of technical features, the present invention has the following advantages compared with the prior art:

1. The side walls and the base of the cabinet are designed as having a tri-layer structure composed of multiple hollow cells or grids, making the cabinet light in weight.
2. Using the aluminum honeycomb panel of a hexagonal-celled hollow geometric structure as an inner layer of the side wall confers the honeycomb panel with such properties as high pressure-endurable strength, light weight, excellent rigidity and high structural stability. In addition, the hexagonal hollow cells can also make the honeycomb panel capable of better thermal insulation by preventing the air flow.

3. The cabinet is stabilized using the middle strengthening assembly that is formed by interlacing the horizontal tension rods with the vertical tension rods.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims.

What is claimed is:

1. A thermally insulated, rigid cabinet, comprising:
a top cover;
four side walls having a tri-layer structure; and
a base having a tri-layer structure;
wherein the tri-layer structure includes an inner honeycomb panel, a middle strengthening assembly, and an outer wall panel; the middle strengthening assembly is formed by a plurality of horizontal tension rods and a plurality of vertical tension rods intersecting; the top cover, the side walls, and the base are connected with and fixed to one another by an aluminum extrusion fixing assembly; the aluminum extrusion fixing assembly comprises a first aluminum extrusion tube, a second aluminum extrusion tube, and a third aluminum extrusion tube; the first aluminum extrusion tube is connected in parallel side-to-side to the second aluminum extrusion tube, the first aluminum extrusion tube is connected in perpendicular side-to-side to the third aluminum extrusion tube; the first aluminum extrusion tube is provided with a first, long groove located on a first sidewall thereof; a sidewall of the first long groove extends inwards to form a protruding portion; a leak-proof groove is provided on a bottom side within the first long groove.

2. The thermally insulated, rigid cabinet of claim 1, wherein the first aluminum extrusion tube is further provided with a second long groove located on a second sidewall perpendicular to the first sidewall thereof; a sidewall of the second long groove extends inwards to form a protruding portion; a leak-proof groove is provided on a bottom side within the second long groove.

* * * * *